United States Patent
Tsu et al.

Patent Number: 6,060,354
Date of Patent: May 9, 2000

[54] IN-SITU DOPED ROUGH POLYSILICON STORAGE CELL STRUCTURE FORMED USING GAS PHASE NUCLEATION

[75] Inventors: Robert Tsu; William R. McKee, both of Plano; Ming-Jang Hwang, Richardson, all of Tex.

[73] Assignee: Texas Instruments Incorporated, Dallas, Tex.

[21] Appl. No.: 08/993,099

[22] Filed: Dec. 18, 1997

Related U.S. Application Data

[60] Provisional application No. 60/033,723, Dec. 20, 1996.

[51] Int. Cl.⁷ ............... H01L 21/8234; H01L 21/8242
[52] U.S. Cl. .................... 438/255; 438/398; 438/964
[58] Field of Search .................... 438/253, 255, 438/396, 398, 964

[56] References Cited

U.S. PATENT DOCUMENTS

| | | | |
|---|---|---|---|
| 5,112,773 | 5/1992 | Tuttle | 437/109 |
| 5,290,729 | 3/1994 | Hayashide et al. | 437/60 |
| 5,679,596 | 10/1997 | Lu . | |
| 5,760,434 | 6/1998 | Zahurak et al. | 257/309 |
| 5,854,105 | 12/1998 | Tseng | 438/253 |
| 5,858,837 | 1/1999 | Sakoh et al. | 438/255 |
| 5,907,772 | 5/1999 | Iwasaki | 438/253 |

FOREIGN PATENT DOCUMENTS 0 448 374 A1   3/1991   European Pat. Off. ........ H01L 29/94

OTHER PUBLICATIONS

Watanabe et al. Hemispherical Grained Si Formation on in–situ Phosphorous Doped Amorphous–Si Electrode for 256Mb DRAM's Capacitor. IEEE Transactions on Electron Devices, vol. 42, No. 7, Jul. 1995. pp. 1247–1254.

Lo et al. Dynamic–Stressed–Induced Dielectric Breakdown in Ultrathin Nitride/Oxide Stacked Films Deposited on Rugged Polysilicon. IEEE Transactions on Electron Devices, vol. 13, No. 4, Apr. 1992, pp 183–185.

Wise et al. TI/TEL Rugged Polysilicon Deposition Joint Development Project: Phase I—Planning and Planar Capacitor Fabrication. Texas Instruments/Tokyo Electron, Limited. Technical Activity Report, Feb. 1995.

Okuyama et al. Gas–Phase Nucleation in GaAs Thin Film Preparation by Metal Organic Chemical Vapor Deposition. Jpn. J. Appl. Phys. vol. 31, Part 1, No. 1, pp. 1–11. Jan. 1992.

Vahala et al. Lower–dimensional quantum structures by selective growth and gas–phase nucleation. J. Vac. Sci. Technol. B 11(4), Jul./Aug. 1993, pp. 1660–1666.

*Primary Examiner*—Richard Booth
*Attorney, Agent, or Firm*—Robby T. Holland; Carlton H. Hoel; Frederick J. Telecky, Jr.

[57] ABSTRACT

A method for forming a semiconductor memory device storage cell structure having an increased surface area. The storage cell structure has one or more rough polysilicon surfaces formed by depositing the polysilicon under conditions that result in gas phase dominant nucleation.

7 Claims, 1 Drawing Sheet

IN-SITU DOPED ROUGH POLYSILICON STORAGE CELL STRUCTURE FORMED USING GAS PHASE NUCLEATION

This is a Non Provisional application filed under 35 USC 119(e) and claims priority of prior provisional, Serial No. 60/033,723 of inventor Tsu, et al, filed Dec. 20, 1996.

TECHNICAL FIELD OF THE INVENTION

The present invention generally relates to semiconductor devices and methods of manufacture, and more particularly to an in-situ doped, rough polysilicon structure formed using gas phase nucleation, and the method for forming that structure.

BACKGROUND OF THE INVENTION

As semiconductor memory device dimensions continue to shrink, and the corresponding density continues to increase by a 4× rule, the storage cell gets increasingly smaller while the required storage charge remains about the same. Conventional oxynitride (N/O or O/N/O) dielectrics have a relatively low capacitance per unit area (~7.7 fF/um2, for an effective oxide thickness of 4.5 nm) that limits the storage capacity because of high tunneling leakage. To combat this problem, various area enhancement technique have been proposed, including hemispherical grain (HSG) or rough polysilicon film growth techniques, and disk, fin, and corrugated cylindrical cell (CCC) cell structures.

Storage cells that incorporate fins, disks, and CCC formations are primarily composed of multiple horizontal fins to add surface area. However, as the storage cell size is further decreased, the horizontal fins add less surface area than vertical sidewalls. Furthermore, the typical fin-type structure is a less robust structure that can more easily sustain damage during processing, especially during oxide and particle removal between the fins.

Storage cells incorporating roughened polysilicon have been proposed using thin film growth techniques including HSG, ion implementation, and native oxide promoted rough polysilicon growth. Little or no leakage penalty has been identified for the rough storage polysilicon cell structures as compared to the smooth polysilicon structures. However, these growth techniques involve depositing the rough polysilicon onto undoped polysilicon. Therefore, additional doping is required to avoid interfacial depletion, introducing a low capacitance layer coupled with N/O thin dielectrics. The HSG technique typically further requires multiple complex deposition and annealing steps performed within a relatively narrow deposition temperature window (5–10 degrees C.). The rough polysilicon technique typically further requires native oxide as a base in order to form rough surfaces. Therefore, conventional HSG and rough polysilicon formation techniques do not provide a robust technology for manufacturing. As a result, a storage cell grown using conventional HSG or rough polysilicon techniques typically lacks desired mechanical strength and stability.

Gas phase nucleation has been used as a growth technique to deposit GaAs clusters for formation of quantum dots. Controlling the gas phase nucleation enables control of sizes of gas phase nucleated particles and surface morphology. A detailed description of gas phase nucleation kinetics is provided in the following references: "Gas-Phase Nucleation in GaAs Thin Film Preparation by Metal Organic Chemical Vapor Deposition," K. Okuyama, D. D. Huang, J. H. Seinfeld, N. Tani, and I. Mansui, Japan Journal of Applied Physics, Volume 31, pp 1–11 (1992); and "Lower-Dimensional Quantum Structures by Selective Growth and Gas-Phase Nucleation," K. J. Vahala, W. A. Saunders, C. S. Tsai, P. C. Sercel, T. Kuech, H. A. Atwater, and R. C. Flagan, Journal of Vacuum Science Technology, B11, 1660 (1993). Gas phase nucleation has typically been avoided in deposition of polysilicon due to resulting rough structure and particulate generation during the gas phase.

SUMMARY OF THE INVENTION

The present invention provides a method for forming a semiconductor memory device storage cell that substantially eliminates or reduces disadvantages and problems associated with previously developed semiconductor memory device storage cells.

More specifically, the present invention provides a method for forming a semiconductor memory device storage cell structure having an increased surface area. The storage cell structure of the present invention will have one or more rough polysilicon surfaces formed by depositing the polysilicon under conditions that result in gas phase dominant nucleation. The resulting storage cell will have rough polysilicon surfaces rather than smooth polysilicon surfaces associated with surface phase nucleation.

The present invention provides a technical advantage by increasing the surface area of a storage cell due to build-up of a rough polysilicon structure in three dimensions. The method employs simplified rough polysilicon formation processes, while increasing the total surface area, and thereby, increasing the total capacitance per storage cell. The total capacitance of a rough surface storage cell formed using the method of the present invention can have two or more times the capacitance of a storage cell with smooth polysilicon surfaces.

The present invention provides other technical advantages of a single process to grow rough polysilicon for varying size storage cells. As an example, the processes of the present invention used to form 64M DRAM storage cells are identical as those used to form 256M DRAM storage cells.

A further technical advantage of the present invention is the provision of a relatively large process window. This reduces the complexity of the process as compared to typical HSG formation processes.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

The present invention utilizes gas phase nucleation to grow in-situ doped, rough polysilicon structures. The present invention provides a method of forming a rough polysilicon structure that employs gas phase nucleation as a dominant growth technique, rather than surface reaction growth, combined with in-situ gas phase doping. The in-situ gas phase doping mixes the dopant gases in the reactant species in order to achieve a particular roughness of the cell surfaces. The resulting rough surface polysilicon structure provides an increased surface area to increase the storage cell capacitance.

Figure 1:
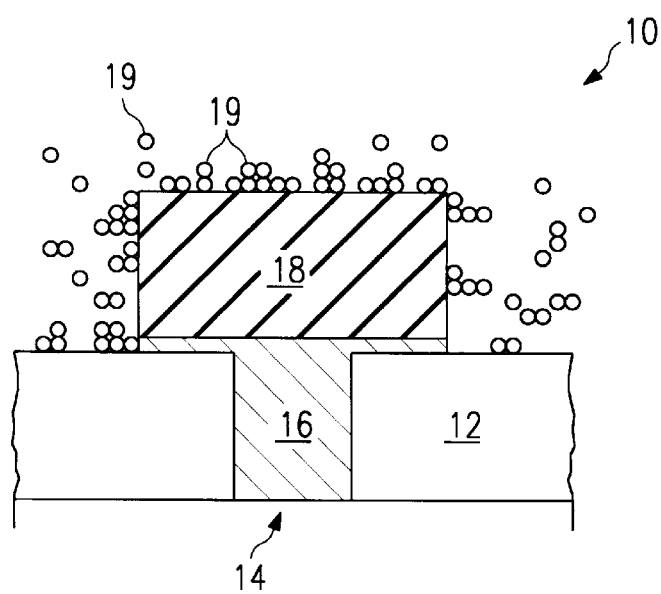
FIG. 1 shows an embodiment of a partially formed single crown storage cell structure undergoing a gas phase nucleation deposition of polysilicon that results in the deposition of a rough polysilicon.
Figure 2:
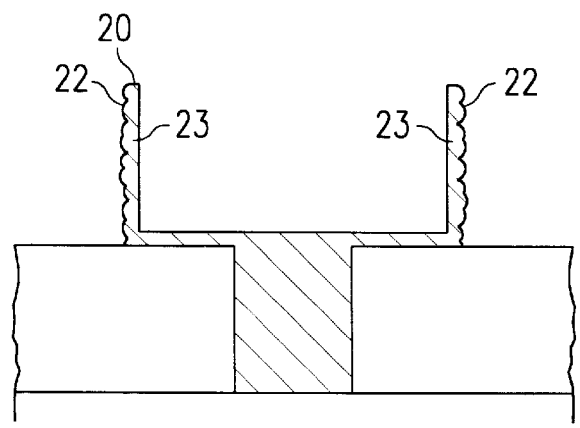
FIG. 2 shows the embodiment of FIG. 1 after gas phase nucleation rough polysilicon deposition, a rough polysilicon layer etchback, and an oxide etchback.
Figure 3:
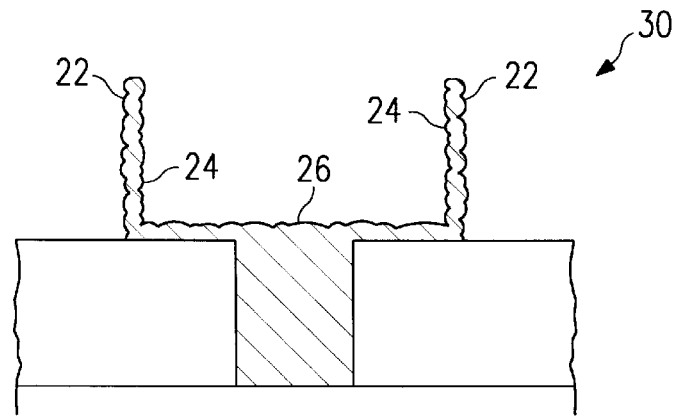
FIG. 3 shows the embodiment of FIG. 2 after performing an additional gas phase nucleation rough polysilicon deposition and a rough polysilicon layer etchback.

FIGS. 1–3 illustrate the formation of a single crown storage cell structure having rough, in-situ doped polysilicon surfaces. It should be understood, however, that the formation methodology of the present invention can be used on a variety of storage cell structures including multiple crown structures to form rough, in-situ doped polysilicon surfaces that provide an increased surface area as compared to smooth polysilicon structures.

As shown in FIG. 1, formation of a rough surface single crown storage cell embodiment of the present invention initially follows that of a conventional smooth surface single crown storage cell. As in the formation of a conventional smooth surface polysilicon storage cell, a storage plug 14 is formed in a memory cell array insulating layer 12, for example comprising TEOS oxide (TEOS) or boron phosphate silicate glass (BPSG), and is filled with in-situ doped polysilicon by depositing polysilicon to form a base polysilicon layer 16. An insulating layer 18, such as $SiO_2$, is deposited over the base polysilicon layer 16, followed by conventional patterning, etching, and resist removal.

For a conventional, smooth polysilicon surface storage cell, in-situ doped polysilicon would then be deposited on the patterned structure to form a polysilicon vertical wall structure of the storage cell. For this conventional storage cell, the in-situ doped polysilicon wall structure layer would be grown using surface reaction dominant nucleated deposition that results in a smooth polysilicon surface. The resulting polysilicon wall structure layer forms side walls and covers the top surface of the insulating layer 18. The in-situ doped polysilicon wall structure layer is then etched back, followed by an etch back of the insulating layer 18, resulting in a single crown storage cell with smooth vertical and horizontal polysilicon surfaces. A conventional smooth surface storage capacitor can then be formed, for example, by depositing an N/O or other dielectric into the storage cell and depositing in-situ doped polysilicon onto the cell to form a top plate.

According to the present invention, a gas phase nucleation in-situ doped polysilicon deposition process is used to produce gas phase reaction dominant growth as shown in FIG. 1 rather than surface reaction dominant growth. In-situ doped polysilicon particles 19 are deposited onto the partially formed structure 10 using gas phase dominant nucleation to form roughened polysilicon wall structure layer 20. Approximate process conditions and materials for two embodiments of gas phase nucleation dominant in-situ doped polysilicon deposition are indicated in Table 1.

TABLE 1

Process Conditions for Gas Phase Nucleation Dominant In-Situ Doped Polysilicon Growth

| Processes | Materials | Temperatures | Pressures | Gas Ratio |
|---|---|---|---|---|
| In-situ doped polysilicon | Si2H6/PH3, Si2H6/AsH3 | 600–750 C. | 0.5–100 Torr | 25/1–10/1 |
| In-situ doped polysilicon | SiH4/PH3, SiH4/AsH3 | 600–800 C. | 1–100 Torr | 25/1 |

After the gas phase nucleation deposition of the first roughened polysilicon wall structure layer 20, an etchback of the first roughened polysilicon layer 20 and the insulating layer 18 is performed. As indicated in FIG. 2, resulting vertical side walls 23 having a rough outer polysilicon surface 22 are formed from the remaining portions of the first roughened polysilicon wall structure layer 20. The vertical side walls 22 have an increased surface area as compared to conventional storage cell side walls having smooth outer polysilicon surfaces.

In order to provide a storage cell structure 30 with rough inner surfaces 24 and 26, an additional gas phase dominant growth of roughened in-situ doped polysilicon and etchback can be performed prior to an N/O or other dielectric deposition. As shown in FIG. 3, this second gas phase nucleation in-situ doped polysilicon deposition provides a storage cell structure 30 having rough surfaces 22, 24, and 26 formed on the surfaces of the storage cell 30. A storage capacitor having roughened surfaces can be formed by depositing a dielectric and a top plate.

A post-annealing step can be performed at temperatures ranging from approximately 700 degrees Celsius to approximately 900 degrees Celsius to initiate grain growth to increase surface area if the deposited polysilicon is in a polycrystalline phase. The post-anneal step can also smooth out sharp corners to reduce the electrical field which otherwise can result in a higher leakage current.

The gas phase nucleated rough in-situ doped polysilicon storage cell can result in two or more times the storage capacitance of a conventional smooth surface storage cell. The formation methodology of the present invention achieves an increased capacitance storage cell using a simpler technique than used by conventional area enhancement techniques. The increased surface area is produced using a method of formation that incorporates gas phase dominant nucleation. The resulting storage cell has rough polysilicon surfaces rather than the smooth polysilicon surfaces associated with surface phase nucleation. The present invention is generally useful to form rough polysilicon surfaces during any polysilicon deposition step during the formation of a storage cell.

Although the present invention has been described in detail, it should be understood that various changes, substitutions and alterations can be made thereto without departing from the spirit and scope of the invention as described by the appended claims.

What is claimed is:

1. A method for forming a rough polysilicon structure for use in a semiconductor memory device storage cell, comprising the steps of:

depositing polysilicon onto an insulating layer to form a base polysilicon layer;

depositing a masking material onto the base polysilicon layer to form a masking material structure;

depositing in-situ doped polysilicon onto the masking material structure and base polysilicon layer through gas phase dominant nucleation under temperatures in the range of approximately 600 degree Celsius to approximately 800 degrees Celsius, under pressures in the range of approximately 0.5 Torr to approximately 100 Torr and with a gas ration in the range of approximately 10 to 1 to approximately 25 to 1 to form a rough polysilicon vertical wall layer having a rough polysilicon exterior surface;

etching the rough polysilicon vertical wall layer to expose the masking material structure; and etching the masking material structure to expose the base polysilicon layer to form rough polysilicon side wall structures having a rough exterior surface.

2. The method of claim 1, wherein the deposition of polysilicon to form the rough polysilicon layer further comprises depositing in-situ doped $Si_2H_6/PH_3$ and in-situ doped $Si_2H_6/AsH_3$ materials.

3. The method of claim 1, wherein the deposition of polysilicon to form the rough polysilicon layer further comprises depositing in-situ doped $SiH_4/PH_3$ and in-situ doped $SiH_4/AsH_3$ materials.

4. The method of claim 1, wherein depositing polysilicon to form a base polysilicon layer further comprises depositing the polysilicon over a plug formed in an insulating layer and over the insulating layer.

5. The method of claim 1, wherein depositing a masking material onto the base polysilicon layer further comprises depositing an oxide.

6. The method of claim 1, further comprising:

depositing a dielectric into the rough polysilicon structure; and depositing polysilicon to form a top plate, thereby forming a memory cell storage capacitor.

7. The method of claim 1, further comprising the step of:

post-annealing the rough polysilicon structure at temperatures ranging from approximately 700 degrees Celsius to approximately 900 degrees Celsius to initiate grain growth in the polysilicon and smooth out sharp corners in the rough polysilicon structure.

* * * * *